United States Patent
Josell et al.

(10) Patent No.: US 7,429,401 B2
(45) Date of Patent: Sep. 30, 2008

(54) SUPERCONFORMAL METAL DEPOSITION USING DERIVATIZED SUBSTRATES

(75) Inventors: Daniel Josell, Gaithersburg, MD (US); Thomas P. Moffat, Gaithersburg, MD (US); Daniel Wheeler, Gaithersburg, MD (US)

(73) Assignee: The United States of America as represented by the Secretary of Commerce, the National Insitiute of Standards & Technology, Washington, DC (US)

( * ) Notice: Subject to any disclaimer, the term of this patent is extended or adjusted under 35 U.S.C. 154(b) by 773 days.

(21) Appl. No.: 10/444,060

(22) Filed: May 23, 2003

(65) Prior Publication Data

US 2004/0231998 A1 Nov. 25, 2004

(51) Int. Cl.
*B05D 5/12* (2006.01)
*B05D 3/04* (2006.01)

(52) U.S. Cl. .................... 427/98.1; 427/96.1; 427/97.2; 427/301; 427/304; 427/305

(58) Field of Classification Search .................. 427/96, 427/97, 98, 301, 304, 305, 96.1, 97.2, 98.1; 205/210, 123
See application file for complete search history.

(56) References Cited

U.S. PATENT DOCUMENTS

| | | | | |
|---|---|---|---|---|
| 3,011,920 A | * | 12/1961 | Shipley, Jr. ................. | 106/1.11 |
| 6,077,780 A | * | 6/2000 | Dubin ......................... | 438/687 |
| 6,333,120 B1 | | 12/2001 | DeHaven et al. ............. | 428/615 |
| 6,344,129 B1 | | 2/2002 | Rodbell et al. .............. | 205/291 |
| 6,410,418 B1 | | 6/2002 | Yang .......................... | 438/626 |
| 6,410,442 B1 | | 6/2002 | Yang .......................... | 438/692 |
| 6,429,523 B1 | | 8/2002 | Andricacos et al. ......... | 257/758 |
| 6,534,116 B2 | * | 3/2003 | Basol ......................... | 438/667 |
| 6,680,273 B2 | * | 1/2004 | Goosey et al. .............. | 502/150 |
| 6,755,954 B2 | * | 6/2004 | Mayer et al. .................. | 205/96 |
| 6,827,833 B2 | * | 12/2004 | Taylor et al. ................ | 205/103 |
| 7,045,461 B2 | * | 5/2006 | Imori et al. ................. | 438/678 |
| 2002/0043467 A1 | | 4/2002 | Morrissey et al. | |
| 2002/0066673 A1 | | 6/2002 | Rodbell et al. | |
| 2002/0074231 A1 | | 6/2002 | Mikkola et al. | |
| 2002/0084193 A1 | | 7/2002 | Merricks et al. | |
| 2002/0088713 A1 | | 7/2002 | Merricks et al. | |
| 2002/0090484 A1 | | 7/2002 | Merricks et al. | |
| 2002/0092673 A1 | | 7/2002 | Andricacos et al. | |
| 2002/0171151 A1 | | 11/2002 | Andricacos et al. | |
| 2004/0182714 A1 | * | 9/2004 | Imori et al. ................. | 205/123 |

OTHER PUBLICATIONS

Hebert, "Analysis of Current-Potential Hysteresis During Electrodeposition of Copper with Additives", Journal of the Electrochemical Society (no month, 2001), vol. 148, No. 11, pp. C726-C732. Abstract only.*

(Continued)

*Primary Examiner*—Edna Wong
(74) *Attorney, Agent, or Firm*—Novak Druce & Quigg LLP

(57) ABSTRACT

The process of this invention involves first adsorbing a catalyst on the surface of a specimen by immersion in a catalyst-containing solution, followed by electrolytic deposition in a second solution that need not contain catalyst. This two-step superconformal process produces a seam-free and void-free metal microelectronic conductor.

4 Claims, 2 Drawing Sheets

OTHER PUBLICATIONS

Moffat et al., "Superconformal Electrodeposition Using Derivitized Substrates", Electrochemical and Solid-State Letters, vol. 5, No. 12, C110-C112 (no month, 2002).*

"Numerical Simulation of Superconformal Electrodeposition Using the Level Set method"; Wheeler et al (NIST); Modeling and Simulation of Microsystems 2002; 422-425, no month.

Metallurgy Divisional Publications -NISTIR 6907; Technical Highlights; "Magnetization Dynamics in Films with Nanometer Scale Microstructure"; Materials Science and Engineering Laboratory; 1-24, no date.

"Copper Electroplating for Damascene Processing"; Huong Que Tran, Department of Chemical Engineering, Georgia Institute of Technology, Atlanta, GA; 1-7, no date.

"Physics and Semiconductors"; "New Spectroscopy Tool Probes Semiconductor Etching Processes"; NIST Update; Sep. 4, 2001.

"Superconformal Silver Deposition Using KseCN Derivatized Substrates"; B.C. Baker et al; Electrochemical and Solid-State Letters, 6(5) C67-C69 (2003), no month.

"Superconformal Electrodeposition of Copper"; T. P. Moffat et al; Electrochemical and Solid-State Letters, 4(4) C26-C29 (2001), no month.

"Superconformal Electrodeposition Using Derivitized Substrates"; T. P. Moffat et al; Electrochemical and Solid-State Letters, 5(12) C110-C112 (2002), no month.

"Via Filling by Electrodeposition"; "Superconformal Silver and Copper and Conformal Nickel"; D. Josell et al; Journal of The Electrochemical Society, 149 (12) C637-C641 (2002), no month.

"Superconformal Electrodeposition of Silver in Submicrometer Features"; T. P. Moffat et al; Journal of The Electrochemical Society, 149 (8) C423-C428 (2002), no month.

"Superconformal Electrodeposition in Vias"; D. Josell et al; Electrochemical and Solid-State Letters, 5 (4) C49-C52 (2002), no month.

"Superconformal Deposition by Surfactant-Cataylized Chemical Vapor Deposition"; D. Josell et al; Electrochemical and Solid-State Letters, 5 (3) C44-C47 (2002), no month.

"A Simple Equation for Predicting Superconformal Electrodeposition in Submicrometer Trenches"; D. Josell et al; Journal of The Electrochemical Society, 148 (12) C767-C773 (2001), no month.

"Superconformal Electrodeposition in Submicron Features"; D. Josell et al; Physical Review Letters; Jul. 2, 2001, vol. 1.

* cited by examiner

US 7,429,401 B2

SUPERCONFORMAL METAL DEPOSITION USING DERIVATIZED SUBSTRATES

BACKGROUND OF THE INVENTION

1. Field of the Invention

The present invention relates to a two-step superconformal process for depositing seam-free microelectronic conductors.

2. Background

In the recent development of semiconductor fabrication technologies, the replacement of aluminum-based alloys by pure copper as a chip interconnection material results in numerous advantages in the chip performance. Conventionally, aluminum-copper and its related alloys have been used as a preferred metal conductor material for forming interconnections on electronic devices such as IC chips. The copper content in an aluminum-copper alloy is limited typically to a range between about 0.3 and about 4%.

The chip performance improvements made possible by pure copper or copper alloys includes a lower electrical resistivity since the resistivity of copper and certain copper alloys is less than the resistivity of aluminum-copper. Based on the low resistivity of copper, narrower lines can be used and higher wiring densities can also be realized.

While the advantages of copper metallization have been recognized by many in the semiconductor industry, copper metallization has been the subject of extensive research effort in recent years. Semiconductor processes such as chemical vapor deposition (CVD) and electroless plating are popularly used for depositing copper. Both of these methods of deposition produce at best conformal deposits and sometimes lead to defects such as voids in a wiring structure, especially when trenches are deposited which have a cross-section narrower at the top than at the bottom as a result of an imperfect reactive ion etching process. Similarly, while the electroless plating technique offers the advantage of low cost, the evolution of hydrogen gas during deposition leads to blistering and other void defects which are detrimental to the quality and reliability of IC devices built.

One such electroplating processes for depositing copper, silver or gold onto a semiconductor wafer is described in U.S. Pat. No. 5,256,274, herein incorporated by reference in its entirety, issued in 1993. In this patent, a copper conductor which is obtained with a seam at its center is judged as a good deposition while a copper conductor with a void at its center is judged as bad deposition. The plating bath utilized in the patent contains 12 ounces/gallon of water of $CuSO_4$ $5H_2O$, 10% by volume of concentrated sulfuric acid, 50 ppm of chloride ion from hydrochloric acid, and TECHNI-COPPER W additive at 0.4% by volume provided by Technic, Inc. of Providence, R.I. The resulting structures contained seams.

The electroplated copper that is presently being used as line and via level interconnections in semiconductor devices suffers from an initially high resistance which requires either a long time, i.e., three days, room temperature anneal or some shorter time elevated temperature anneal to reduce the films to acceptable resistance levels. Typically, electroplated copper films are deposited in a fine grained condition from baths that contain additives or dopants. With time, these initially small copper grains, i.e., in the range of approximately 20 nm, grow to a final large grain, i.e., in the range of 1,000 nm, low stress microstructure during which time a resistance drop of approximately 20-30% occurs. The long anneal times required therefore places unacceptable limits on the fabrication process which results in a more expensive copper process. In order to speed up the fabrication processes, it is important that this grain growth and associated resistance drop, i.e., the resistance transient, occur in as short a time as possible. The large grained, low resistance, plated copper is preferred since it has both better electromigration stress voiding behavior than fine grained copper films and the desired high electrical conductivity.

The technology of making metal conductors to provide for trenches, vias, lines and other recesses in semiconductor chip structures, flat panel displays and package applications has been developed recently. For instance, in developing interconnection technology for very-large-scale-integrated (VLSI) structures, aluminum has been utilized as the primary metal source for contacts and interconnects in semiconductor regions or devices located on a single substrate. Aluminum has been the material of choice because of its low cost, good ohmic contact and high conductivity. However, pure aluminum thin-film conductors have undesirable properties such as a low melting point which limits its use to low temperature processing and possible diffusion into the silicon during annealing which leads to contact and junction failure, and poor electromigration resistance. Consequently, a number of aluminum alloys have been developed which provided advances over pure aluminum.

Recently developed ULSI (ultra large scale integration) technology has placed more stringent demands on the wiring requirements due to the extremely high circuit densities and faster operating speeds required of such devices. This leads to higher current densities in increasingly smaller conductor lines. As a result, higher conductance wiring is desired which requires either larger cross-section wires for aluminum alloy conductors or a different wiring material that has a higher conductance. The obvious choice in the industry is to develop the latter which includes pure copper for its desirable high conductivity.

In the formation of ULSI interconnection structures such as trenches, vias and lines, copper can be deposited into such recesses to interconnect semiconductor regions or devices located on the same substrate. However, copper is known to have problems in semiconductor devices. The electromigration phenomenon occurs when the superposition of an electric field onto random thermal diffusion in a metallic solid causes a net drift of atoms in the "direction of electron flow. This can lead to degradation in interconnect reliability. Diffusion of copper atoms into the silicon substrate or ILD can also cause device failure and poor reliability. In addition, pure copper does not adhere well to oxygen-containing dielectrics such as silicon dioxide and polyimide. To fully utilize copper in interconnection technology, the adhesion, diffusion and electromigration properties of copper must be improved.

More recently, void-free and seamless conductors are produced by electroplating copper from plating baths that contain additives. One such method is described by U.S. Pat. No. 6,429,523, herein incorporated by reference in its entirety. The capability of the electroplating method to superfill structural features without leaving voids or seams is unique and superior to that of other deposition techniques. Electrolytic copper plating techniques used in damascene structures can be defect-free if the deposited seed layer is continuous and has a uniform thickness even in the deepest area of the structural feature to be plated. The copper seed layer is typically deposited by a physical vapor deposition technique or other techniques over a barrier layer that prevents diffusion of copper into the insulator such as Ta, TaN, TiN or TaSiN. When the deposited seed layer is too thin at the bottom or near-bottom walls of a structural feature, plating does not occur and a void is created.

In order to eliminate the non-continuous deposition problem occurring in sputter deposited copper seed layers, a seed layer of a larger thickness is normally deposited. The deposition of a thick seed layer helps to eliminate the plated Cu voiding problem, however, it creates another one of equal or even greater significance, i.e. poor electromigration resistance in the resultant structure. The poor electromigration resistance of the structure is caused by the fact that the seed layer itself has weak electromigration resistance when compared to the much higher electromigration resistance of the plated film. It is also noted that in future generations of chips, the seed layer will contribute an increasing part of the total structure based on the decreasing dimensions of the features and the inability to decrease the thickness of the seed layer proportionally for reasons stated above as well as the thickness uniformity requirements in electrolytic plating.

The use of electrodeposited copper in integrated circuits is due, in part, to the ability of the deposition process to fill high aspect ratio features superconformally. Understanding the "superfilling" process has been complicated by the presence of both deposition rate suppressing (inhibitor) and deposition-rate accelerating (catalyst) additives in the electrolytes. Initially, efforts were made to extend leveling theory, whereby inhibitor depletion in the electrolyte within patterned features results in a nonuniform deposition rate and smoothing of the surface profile. However, it was found that this formalism failed to explain the filling process in submicrometer features and an empirically modified constitutive equation was required to simulate feature filling.

In the first such efforts the constitutive fitting equation provided the sole distinction between leveling and superfilling. Subsequently, an attempt to reconcile superfilling with a more robust description of the traditional leveling model has been accomplished. Nonetheless, comparison between these models and experimental observations revealed that superfilling could not be explained by an inhibition or leveling model.

Recently, a curvature-enhanced accelerator coverage (CEAC) mechanism has been shown to quantitatively describe superconformal film growth.

The CEAC mechanism is described in Superconformal Electrodeposition Using Derivitized Substrates, *Electrochemical and Solid-State Letters*, 5 (12) C110-C112 (2002), herein incorporated by reference in its entirety. In this model, the accelerator, or catalyst, is considered to displace the inhibiting halide-cuprous-polyether species from the interface and remain segregated at the interface during metal deposition. Because the growth rate is directly proportional to the catalyst coverage, these stipulations naturally give rise to "bottom-up" or superfilling of submicrometer features as the catalyst coverage and metal deposition rate steadily increase during conformal growth on a concave surface such as the bottom of a filling feature. The CEAC mechanism has been incorporated into several different shape change models and successfully predicts the initial incubation period of conformal deposition, the superconformal bottom-to-to filling itself, and the subsequent "momentum plating" or bump formation over filled features that are commonly observed. None of these aspects of filling could be explained by the leveling models. The CEAC models allow filling over the entire experimental parameter space, i.e., catalyst precursor concentration, overpotential, and feature aspect ratio, to be explored for both trench and via geometries. Furthermore, these predictions are made with no fitting parameters; all kinetic factors are obtained from deposition studies conducted on planar substrates. More recently, the generality of the CEAC model has been demonstrated by successfully describing superconformal electrodeposition of silver from a selenium catalyzed electrolyte as well as iodine catalyzed copper chemical vapor deposition.

SUMMARY OF THE INVENTION

One difficulty in the utilization and study of "superfilling" cupric sulfate electrolytes has been aging effects associated with disulfide/thiol catalyst chemistry. This has resulted in speculation as to the role of homogeneous electrolyte chemistry in the superfilling process. The Applicants have demonstrated that these effects are not responsible for superfilling. Specifically, superconformal filling of a patterned electrode is demonstrated by first derivitizing the electrode with a submonolayer quantity of catalyst followed by transferring to a catalyst-free inhibited electrolyte for electroplating. For an optimum initial surface coverage, superfilling occurs in complete agreement with the CEAC model. These experiments also suggest a new strategy for circumventing electrolyte aging effects and the associated process control difficulties. The method has been shown to apply to metal deposition, for example, copper and silver electrodeposition. The latter being of some significance to interconnect applications because silver exhibits the lowest intrinsic resistivity of any element. The invention is also applicable to any film growth process that is mediated by a rate controlling interfacial chemical reaction that can be catalyzed by an appropriate surfactant or catalyst.

The present invention is an improved method of producing void-free and seam-free plated conductors on a substrate. Optimal feature filling can be obtained because the period of time necessary to accumulate the catalyst in the conventional process is avoided. The delay of superconformal filling in the conventional process manifests as the incubation period preceeding the onset of "bottom-up" superconformal filling. This "opportunity cost",decreases the aspect ratios of the features that can be successfully filled by the conventional process or, equivalently, decreases the robustness of the process in filling lower aspect ratio features. Related procedures are disclosed in U.S. Pat. Nos. 6,344,129; 6,140,442; 6,410,418; 6,3344,129; and U.S. Published patent application Ser. Nos. 2002/0043467; 2002/0090484; 2002/0088713; 2002/0084193; 2002/0074234 and 2002/0074231, each of which is herein incorporated by reference in its entirety.

DETAILED DESCRIPTION OF THE INVENTION

Two-Step Process

Figure 1:
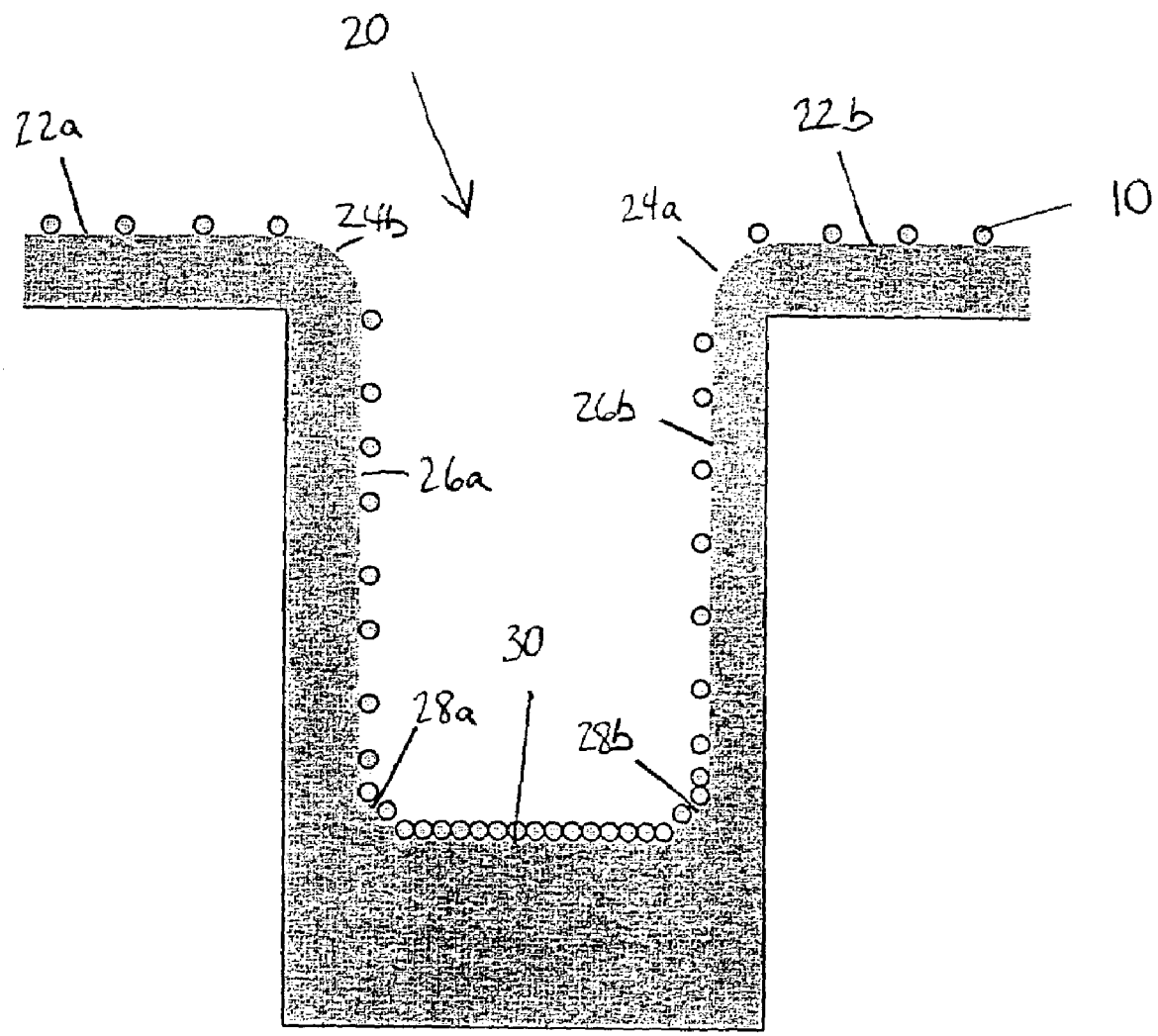
FIG. 1 shows cross-sectioned trenches showing time evolution of feature filling as a function of electrode derivatization.

Step 1: Electrode derivatization—Electrode derivatization is a subject that has received wide study with the adsorption of thiol/disulfide molecules on planar surfaces of noble metals being a model system. The first step of the Two-Step Process, is to derivatize a patterned wafer with catalyst. As an example, a wafer patterned with a repeating trench test structures covered with a copper seed was derivatized with catalyst as the first step in generating the feature filling shown in FIG. 1. The accelerator (i.e., catalyst) was attached to the copper surface by immersion in a stagnant 1.8 mol/L $H_2SO_4$ solution containing 0.5, 5, 50, 500, or 1000 μmol/L of the catalyst precursor, either SPS ($Na_2(SO_3(CH_2)_3S)_2$) or MPSA ($NaSO_3(CH_2)_3SH$). The specimens were then removed after 30 s, rinsed with distilled water, and dried with a tetrafluoroethane duster. For reference, derivatization in 1000 μmol/l, MPSA for 60 s or longer was found, to yield time-independent coverage of catalyst; this maximum value is deemed to be "saturation" coverage. Derivatization in 0.5, 5, 50, or 500 μmol/L SPS and 1000 μmol/L MPSA for 30 s, yielded surface coverages estimated to be 0.002, 0.02, 0.17, 0.84, and 0.97 of the saturated value, respectively. In the adsorption process the disulfide or thiol head group of the catalyst tethers the molecule to the copper substrate while the sulfonate end-group remains-free to interact with the electrolyte; herein, no distinction is made between thiolate versus disulfide formation at the interface. Throughout the specification and claims, the term catalyst is intended to include catalyst precursors, as well as the catalysts themselves. The catalyst can also be a compound or molecule including a functional group for tethering the molecule to the substrate and resulting in disruption of any blocking or rate inhibiting layer. For copper systems, typical catalysts are brighteners or accelerators that are based on sulfur linking chemistry such as thiol or disulfide that also contain a charged terminal group such as sulfonate or phosphonate, such as those taught by "Superconformal Electrodeposition of Copper", *Electrochemical and Solid-State Letters,* 4 (4) C26-C29(2001), herein incorporated by reference in its entirety.

Additionally, when silver is to be deposited on the substrate, sulfur and selenium compounds are preferred, e.g., SeCN, KSCN and Se-alkyl compounds, such as those taught by "Superconformal Silver Deposition Using KSeCN Derivatized Substrates", *Electrochemical and Solid-State Letters,* 6 (5) C67-C69(2003), herein incorporated by reference in its entirety.

The copper seed layer may be added in any manner known in the art. Typical methods are disclosed by U.S. Published patent application Ser. Nos. 2002/0088713 and 2002/0090484. For example, the seed layer may be deposited by sputter deposition, chemical vapor deposition or electroless plating technique prior to Cu plating to achieve better substrate conductivity and improved plating uniformity. The microstructure of the plated film can mimic the microstructure of the seed layer by the present invention novel method. Such a step might therefore utilize controlled grain size and texture of the seed layer in order to control the resulting microstructure and various physical properties of the plated film, as described by U.S. Pat. No. 6,429,523, herein incorporated by reference in its entirety. A copper seed is not necessary for the invention; any material can be used as a seed layer provided that the catalyst can be linked or derivatized to the surface. Thus, a variety of refractory and noble metals might be implemented as seed and/or substrate materials.

Step 2: Electrodeposition. The second step of the Two-Step process involves electrodeposition of metal. As an example of the second step in the Two-Step Process, the derivatized specimens from Step 1 were immediately transferred to an Electrochemical cell containing an electrolyte of 0.24 mol/L $CuSO_4$, 1.8 mol/L $H_2SO_4$, 88 μmol/L PEG (poly(ethylene glycol)) (3,400 Mw), 1 μmol/L NaCl and optionally MPSA (3-mercapto-1-propanesulfonate); all copper deposition was done in this electrolyte. The specimens were inserted vertically into the stagnant electrolyte at an overpotential of —0.25 V, which was applied prior to immersion. They were subsequently removed after predetermined deposition times, rinsed in deionized water, and dried. After cross-sectioning, they were viewed by scanning electron microscopy using standard techniques. FIG. 1 shows the time evolution of feature filling for the five different derivatization conditions, with copper deposition times as indicated. In the following text discussing these experimental results, the specimens are identified by the catalyst precursor concentration used in the derivatization step (i.e., step 1).

For the specimen derivatized in 0.5 μmol/L SPS, deposition proceeds conformally and the surface roughens with increasing film thickness; this behavior is indicative of insufficient catalyst adsorption during the derivatization, consistent with the estimated 0.002 fractional coverage noted. The conformal deposition eventually results in void formation, when the side walls impinge, and formation of a deep cusp above the trench. Identical behavior was observed for substrates which had no preadsorbec catalyst, i.e., 0 μmol/L SPS concentration for derivatization, (not shown). With the increase of SPS concentration from 5 through 500 μmol/L in the derivatization step, one notes more rapid acceleration of deposition at the concave (bottom) corners, which is a characteristic of the inception of the superconformal deposition process. This yields the V-shaped bottom apparent in the specimens plated for 70, 40, and 20 s, following derivatizations in 5, 50, and 500 μmol/L SPS, respectively. Upon further deposition, the V-shaped bottoms are replaced by a new, rapidly rising horizontal growth surface. Between 80 and 100 s, the 5 μmol/L derivatized specimens then exhibit rapid bottom-up filling, a hallmark of the superfilling process. However, by 130 s the sidewalls impinge just before the rapidly advancing trench bottom reaches the top of the trench; this is due to insufficient adsorbed catalyst coverage, as per the estimated 0.02 initial value. In contrast, the 50 μmol/L specimens, with initial coverage estimated at 0.17, exhibit near optimum superfilling behavior with rapid bottom-up filling occurring between 50 and 70 s with negligible sidewall motion. An inversion of the growth front curvature is evident at 70 s, and, by 100 s, a large "bump",is seen above the trench. For the 500 μmol/L SPS and 1 mmol/L MPSA specimens, the surface coverage is effectively at the saturated (unity) value at the start of metal deposition and geometrically driven changes in catalyst coverage associated with the CEAC mechanism are minimal. Additionally, the universally rapid copper deposition, arising from the high coverage of catalyst on all surfaces, results in substantial depletion of the cupric species; this induces the void formation evident in the 40 s 500 μmol/L SPS and 50 s 1 mmol/L MPSA specimens.

As observed in Step 2, the copper deposition rate increases with the catalyst coverage. This indicates that the sulfonate terminated catalyst that was adsorbed in Step 1 hinders the formation of the passivating halide-cuprous-polyethylene glycol layer in the plating electrolyte of Step 2. The results also indicate that the hindrance of passivation increases with coverage of adsorbed catalyst and that the catalyst remains largely segregated at the interface during copper deposition.

Figure 2:
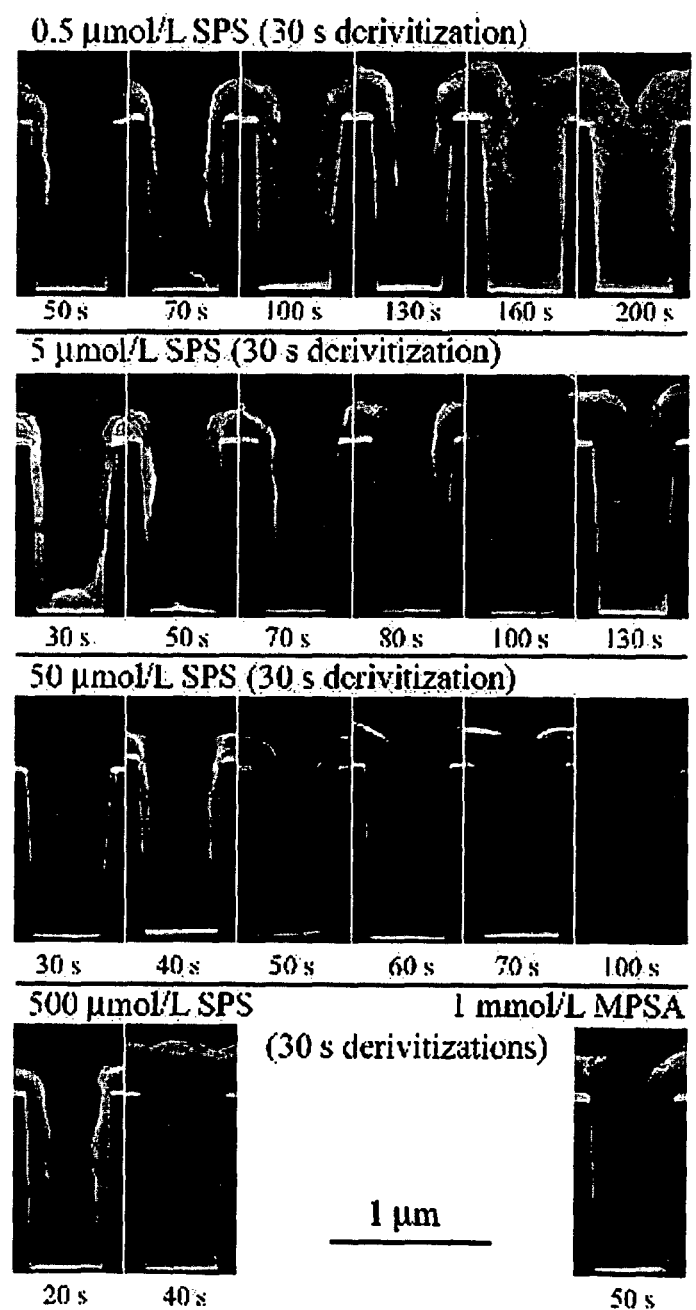
FIG. 2 shows a schematic of the superconformal filling process.

Immediately following Step 1, the catalyst 10 is uniformly scattered across the entire surface of the feature. The coverage on the certain surfaces, such as upper planar surfaces 22*a*, 22*b*, convex surfaces 24*a*, 24*b*, and upstanding sections 26*a*, 26*b*, is not significantly altered by copper deposition during Step 2. According to the CEAC mechanism, as the local area changes during the electroplating, the local catalyst coverage can either increase or decrease depending on the local geometry. In the ease of trenches, grooves, vias or recesses (collectively referred to herein as "features"), catalyst coverage increases during metal deposition on the bottom, generally concave, surface (i.e., the region around the intersection between the bottom surface and vertical sides of a feature). Coverage can decrease around the top convex corners (i.e., the interface between the vertical sides of the feature and the top surface outside the feature) during metal deposition. Thus, the deposition rate becomes highest at the bottom of the feature where the local catalyst coverage is increasing as the local surface area is decreasing. Since the copper deposition rate is increased with the catalyst coverage, this leads to bottom-up filling of the feature as indicated schematically in FIG. 2. However, on other surfaces, including concave surfaces 28a, 28b and bottom surface 30, the local catalyst coverage becomes more concentrated (due to area reduction) as the copper deposition process, Step 2, proceeds. Likewise on convex surfaces 24a, 24b, the catalyst coverage is decreased by the expansion of the surface area and the deposition decreases in this region.

Additives may be included during Step 2. The additives may be added to the bath for accomplishing various objectives. The bath may include a copper salt and a mineral acid. Additives may be included for inducing in the conductor specific film microstructures including large grain size relative to film thickness or randomly oriented grains. Also, additives may be added to the bath for incorporating in the conductor material molecular fragments containing atoms selected from the group consisting of C, O, N, S and Cl whereby the electromigration resistance is enhanced over pure Cu. Furthermore, additives may be added to the bath for inducing in the conductor specific film microstructures including large grain size relative to film thickness or randomly oriented grains, whereby the electromigration behavior is enhanced over non-electroplated Cu.

Examples of specific additives which may be added to a bath in the instant invention are described in several patents. U.S. Pat. No. 4,110,176, which issued on Aug. 29, 1978 to H-G Creutz et al., entitled "Electrodeposition of Copper" describes the use of additives in a plating bath that yield bright, highly ductile, low stress and leveled copper deposits from an aqueous acidic copper plating bath which patent is incorporated herein by reference.

Additionally, according to the present invention, it is possible to superconformally deposit a metal conductor layer without a significant level of catalyst during the metal deposition step.

The shape evolution observed during the superfilling process is qualitatively indistinguishable from results obtained in a single electrolyte containing both catalyst and suppressor.

The transition from conformal to superconformal to sub-conformal filling with increasing catalyst coverage is analogous to the identical transitions observed as a function of SPS or MPSA concentration in an electrolyte containing both catalyst and suppressor.

The shape evolution and growth transitions observed are all predicted by the CEAC mechanism; as in these experiments, the first simulations of trench filling using the CEAC mechanism assumed that all the catalyst was present on the surface at t=0 with no catalyst in the electrolyte.

The time required to fill a given trench decreases with the initial catalyst coverage, as expected due to the underlying role of catalyst in the CEAC mechanism. Indeed, the geometrically differentiated surface reactivity predicted by the CEAC model can dominate filling behavior in spite of substantial metal ion concentration gradients associated with the faster deposition at higher catalyst coverage. For the 50 µmol/L SPS sample, in particular, superconformal filling occurs with deposition on the free surface proceeding at >80% of the diffusion limited current density.

Derivitization (Step 1) followed by metal deposition in a catalyst-free electrolyte (Step 2) allows the consumption of catalyst to be systematically studied. Furthermore, it permits an upper limit for the quantity of thiolate/disulfide incorporated during electroplating to be established, i.e., no more than the submonolayer quantity of catalyst occluded within the bulk electrodeposit.

Additionally, these experiments demonstrate that the differential reactivity responsible for superfilling in the system studied has little to do with homogeneous chemistry involving thiol/disulfide nor the transport of inhibiting species, Cl-PEG.

It should be apparent that embodiments other than those specifically described above may come within the spirit and scope of the present invention. Hence, the present invention is not limited by the above description, but rather is defined by the claims appended hereto.

We claim:

1. A method for plating a metal on a substrate, the substrate comprising at least one feature selected from the group consisting of a trench, groove, via, and recess, the method comprising in sequence, the steps of:
    (1) adsorbing a catalyst on the substrate in the absence of the metal; followed by
    (2) depositing the metal on the surface of the substrate,
    wherein the deposited metal is seam-free and void-free and the catalyst is selected from the group consisting of SPS $(Na_2(SO_3(CH_2)_3S)_2)$, MPSA $(NaSO_3(CH_2)_3SH)$, KSeCN and mixtures thereof.

2. A method for plating a metal on a substrate, the substrate comprising at least one feature selected from the group consisting of a trench, groove, via, and recess, the method comprising in sequence, the steps of:
    (1) adsorbing a catalyst on the substrate in the absence of the metal; followed by
    (2) depositing the metal on the surface of the substrate, whereby the catalyst remains on the surface of the metal during deposition,
    wherein the deposited metal is seam-free and void-free and the adsorbing step is preceded by providing a metal seed in the feature, the metal being able to absorb the catalyst.

3. The method of claim 2, wherein the metal is selected from the group consisting of Cu, Ag, Pt, Ru, Rh, and Ir.

4. A method for plating a metal on a substrate, the substrate comprising at least one feature selected from the group consisting of a trench, groove, via, and recess, the method comprising in sequence, the steps of:
    (1) uniformly adsorbing a catalyst on the substrate in the absence of the metal; followed by
    (2) depositing the metal in the feature, whereby the catalyst moves to and remains with the surface of the metal and said depositing causes said catalyst to become unevenly distributed,
    wherein the deposited metal is seam-free and void-free.

* * * * *